United States Patent
Yang et al.

(10) Patent No.: US 8,159,042 B2
(45) Date of Patent: Apr. 17, 2012

(54) ADOPTING FEATURE OF BURIED ELECTRICALLY CONDUCTIVE LAYER IN DIELECTRICS FOR ELECTRICAL ANTI-FUSE APPLICATION

(75) Inventors: Chih-Chao Yang, Poughkeepsie, NY (US); Lawrence A. Clevenger, LaGrangeville, NY (US); Timothy J. Dalton, Ridgefield, CT (US); Nicholas C. Fuller, Ossining, NY (US); Louis C. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/144,229

(22) Filed: Jun. 23, 2008

(65) Prior Publication Data
US 2008/0283964 A1    Nov. 20, 2008

Related U.S. Application Data

(63) Continuation of application No. 11/207,218, filed on Aug. 19, 2005, now Pat. No. 7,402,463.

(51) Int. Cl.
*H01L 23/52* (2006.01)
(52) U.S. Cl. ................. 257/530; 257/E23.147
(58) Field of Classification Search ............ 257/530, 257/E23.147
See application file for complete search history.

(56) References Cited

U.S. PATENT DOCUMENTS

| | | | |
|---|---|---|---|
| 5,641,985 A * | 6/1997 | Tamura et al. | 257/530 |
| 5,789,795 A | 8/1998 | Sanchez et al. | |
| 6,124,194 A | 9/2000 | Shao et al. | |
| 6,251,710 B1 * | 6/2001 | Radens et al. | 438/131 |
| 6,265,779 B1 * | 7/2001 | Grill et al. | 257/759 |
| 6,294,474 B1 | 9/2001 | Tzeng et al. | |
| 6,335,228 B1 | 1/2002 | Fuller et al. | |
| 6,380,003 B1 | 4/2002 | Jahnes et al. | |
| 6,486,527 B1 | 11/2002 | MacPherson et al. | |
| 6,638,794 B2 | 10/2003 | Tseng | |
| 6,833,604 B2 * | 12/2004 | Tsau | 257/532 |
| 6,870,240 B2 * | 3/2005 | Nakamura | 257/530 |
| 7,300,825 B2 | 11/2007 | Greco et al. | |
| 7,402,463 B2 | 7/2008 | Yang et al. | |

OTHER PUBLICATIONS

Notice of Allowance received in the related U.S. Patent Application, namely U.S. Appl. No. 12/541,502, (Notice of allowance mailed on Dec. 14, 2010).
Office Action received in a related U.S. Patent Application, namely U.S. Appl. No. 12/541,502, (Office Action mailed on Sep. 3, 2010).

* cited by examiner

*Primary Examiner* — Bradley K Smith
*Assistant Examiner* — Mohammad T Karimy
(74) *Attorney, Agent, or Firm* — Scully, Scott, Murphy & Presser, P.C.; Louis J. Percello, Esq.

(57) ABSTRACT

An anti-fuse structure that included a buried electrically conductive, e.g., metallic layer as an anti-fuse material as well as a method of forming such an anti-fuse structure are provided. According to the present invention, the inventive anti-fuse structure comprises regions of leaky dielectric between interconnects. The resistance between these original interconnects starts decreasing when two adjacent interconnects are biased and causes a time-dependent dielectric breakdown, TDDB, phenomenon to occur. Decreasing of the resistance between adjacent interconnects can also be expedited via increasing the local temperature.

22 Claims, 7 Drawing Sheets

ADOPTING FEATURE OF BURIED ELECTRICALLY CONDUCTIVE LAYER IN DIELECTRICS FOR ELECTRICAL ANTI-FUSE APPLICATION

RELATED APPLICATION

This application is a continuation of U.S. patent application Ser. No. 11/207,218, filed Aug. 19, 2005, now U.S. Pat. No. 7,402,463 issued on Jul. 22, 2008.

DESCRIPTION

1. Field of the Invention

The present invention relates to a semiconductor structure, and more particularly to an anti-fuse structure. Specifically, the present invention provides an anti-fuse structure including a buried electrically conductive layer, e.g., a buried metal layer, in a dielectric for electrical anti-fuse application. The present invention also provides a method of fabricating such an anti-fuse structure.

2. Background of the Invention

Anti-fuse structures have been used in the semiconductor industry for memory related applications, such as, for example, field programmable gate arrays and programmable read-only memories. Prior art anti-fuse structures typically include a material which initially has a high resistance, but can be converted into a lower resistance material upon application of certain processes. For example, an unprogrammable anti-fuse type gate array can be programmed by causing selective anti-fuses to become conductive.

FIG. 1 is a cross-sectional representation of a prior art anti-fuse structure which includes a first metal layer 14, an anti-fuse layer 16, and a second metal layer (e.g., interconnect layer) 22 embedded in a dielectric layer 18. During programming, an appropriate voltage between the first metal layer 14 and the second metal layer 22 is applied and that applied voltage creates a conductive path. That is, the applied voltage lowers the electrical resistance of the anti-fuse structure.

The process for integrating the prior art anti-fuse structure mentioned above requires many extra masking and etching steps, which increase the overall fabrication cost. Also, since the programmable voltage for creating the electrical path is a function of the thickness of the anti-fuse layer 16, the anti-fuse material damage, which is a result from a dielectric over-etch, can cause deprogrammed states and result in product failure, i.e., the electrical path is not properly formed when an appropriate voltage is applied. Moreover, the voltage programming method requires a sandwich structure with a layer of anti-fuse material between two 'disconnected' conductive materials. This requirement of the prior art structure illustrated in FIG. 1 limits the design flexibility and enlarges the area required for forming an element, Some variations to the basic anti-fuse structure defined hereinabove can be found in the following literature:

U.S. Pat. No. 5,789,795 to Sanchez, et al. entitled "Method and apparatus for fabricating anti-fuse devices" disclose an etch layer disposed above the anti-fuse material, and an inter-metal oxide layer disposed above the etch layer. The inter-metal oxide has a via formed therein.

U.S. Pat. No. 6,335,228 to Fuller, et al. entitled "Method for making an anti-fuse" provide a process for producing dynamic random access memory (DRAM) having redundant components including steps for concurrently forming normal contacts and anti-fused contacts.

U.S. Pat. No. 6,251,710 to Radens, et al. entitled "Method of making a dual damascene anti-fuse with via before wire" disclose an anti-fuse structure which includes a substrate having a first level of electrically conductive features, a patterned anti-fuse material, a patterned interlevel dielectric material and a second level of electrically conductive features.

U.S. Pat. No. 6,124,194 to Sanchez, et al. entitled "Methods of fabrication of anti-fuse integrated with dual damascene" provide an anti-fuse process which uses a SiN layer to pattern at least openings. First openings expose the metal via and second openings expose a portion of the first dielectric that is above the second metal line.

SUMMARY OF THE INVENTION

The present invention provides an anti-fuse structure that includes a buried electrically conductive layer in a dielectric as an anti-fuse as well as a method of forming such an anti-fuse structure. According to the present invention, the inventive anti-fuse structure comprises regions of leaky dielectric between interconnects. The term "leaky dielectric" is used in the present application to describe a region of dielectric material between adjacent interconnects, and the region of dielectric is embedded with an electrically conductive material. Each of said adjacent interconnects are not electrically in connect with one other, whereby current is generated when a bias is applied between the interconnects. That is, the electrical resistance between these original interconnects starts decreasing when two adjacent interconnects are biased and causes a time-dependent dielectric breakdown, TDDB, phenomenon to occur. Decreasing of the electrical resistance between adjacent interconnects can also be expedited via increasing the local temperature.

One advantage of the present invention over the prior art is that no extra layer of anti-fuse material is required and the inventive method is compatible with current processing without requiring extra critical masking. The fabrication costs of the inventive method are therefore lower. In addition, and unlike prior art structures, the inventive structure does not require a sandwiched anti-fuse material layer between two 'disconnected' conductive materials. Thus, the inventive structure and method offer more flexibility for circuit design than the prior art anti-fuse structures described herein.

In general terms, the present invention provides a semiconductor structure comprising:

an insulator including at least a pair of adjacent interconnects, each interconnect of said pair includes a buried electrically conductive, e.g., metallic, layer embedded in a surface of said insulator and surrounding a portion of each respective interconnect, said buried electrically conductive layers are separated by a dielectric region which permits current flow when a bias is applied between said interconnects of said pair.

In addition to the semiconductor structure described above, the present invention also provides a method of fabricating such a semiconductor structure. Specifically, and in general terms, the inventive method includes the steps of:

providing a structure including an insulator having via and line openings;

forming an organic planarizing material on said structure to fill said via and line openings with said organic planarizing material;

forming an oxide layer having at least one opened area for forming an anti-fuse structure, said at least one opened area is located above a pair of adjacent line openings;

removing at least a portion of said organic planarizing material within said at least one opened area to expose a portion of each pair of said adjacent line openings;

embedding an electrically conductive layer in said insulator between said pair of adjacent line openings;

removing said oxide layer and remaining organic planarizing material;

filling said vias and line openings with at least an electrically conductive interconnect material; and planarizing said electrically conductive interconnect material to an upper surface of said insulator, wherein said planarizing removes said embedded electrically conductive layer from an upper horizontal surface of said insulator forming at least a pair of adjacent interconnects comprising a buried electrically conductive layer surrounding a portion of each respective interconnect, each buried first electrically conductive layer is separated by a dielectric region which permits current flow when a bias is applied between said interconnects of said pair.

BRIEF DESCRIPTION OF THE DRAWINGS OF THE INVENTION

DETAILED DESCRIPTION OF THE INVENTION

The present invention, which provides an anti-fuse structure including a specially modified anti-fuse material (or the buried electrically conductive) layer and a method of fabricating the same, will now be described in greater detail by referring to the following discussion and drawings that accompany the present application. It is noted that the drawings are provided for illustrative purposes and, as such, the drawings are not drawn to scale.

As stated above, the present invention provides an anti-fuse structure that includes a buried electrically conductive layer as an anti-fuse as well as a method of forming such an anti-fuse structure. According to the present invention, the inventive anti-fuse structure comprises regions of leaky dielectric between interconnects. The term "leaky dielectric" is used in the present application to describe a region of dielectric material between adjacent interconnects, and the region of dielectric is embedded with an electrically conductive material. Each of said adjacent interconnects are not electrically in connect with one other, whereby current is generated when a bias is applied to the interconnects. That is, the electrical resistance between these original interconnects starts decreasing when two adjacent interconnects are biased and causes a time-dependent dielectric breakdown, TDDB, phenomenon to occur. Decreasing of the electrical resistance between adjacent interconnects can also be expedited via increasing the local temperature.

Figure 1:
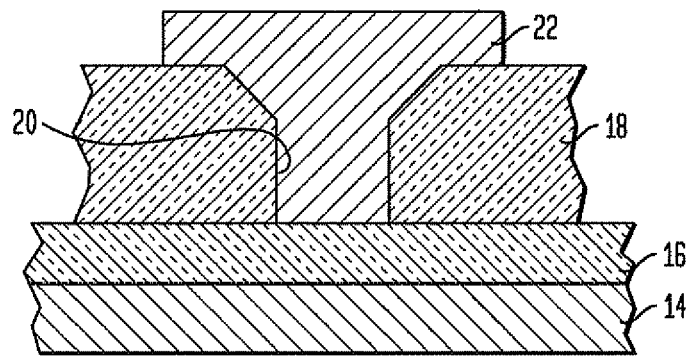
FIG. 1 is a pictorial representation (through a cross sectional view) illustrating a prior art anti-fuse structure.
Figure 2:
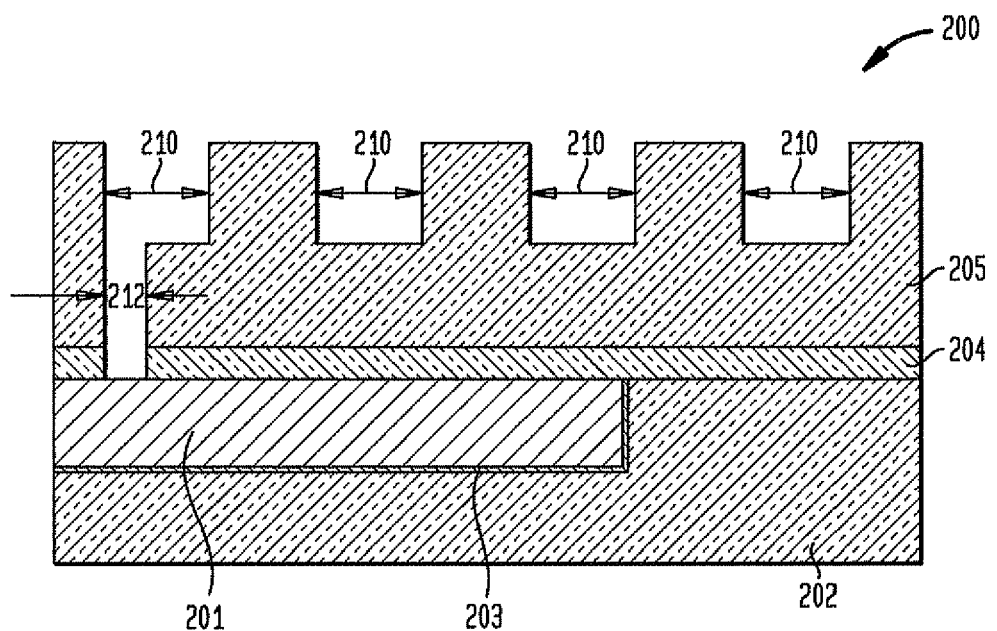
FIGS. 2-9 are pictorial representations (through cross sectional views) illustrating the basic processing steps for fabricating the programmable anti-fuse structure of the present invention.

Reference is first made to FIG. 2 which is a cross sectional view depicting a structure through initial processing steps of the present invention. Specifically, FIG. 2 illustrates a structure 200 that includes a first insulator 202 having at least one interconnect 201 embedded therein. The at least one interconnect 201 is isolated from the first insulator 202 by an optional, yet preferred, first diffusion barrier material 203. The structure 200 also includes a dielectric film 204 located on a surface of the first insulator 202 as well as a portion of the interconnect 201. A second insulator 205 that has line openings 210 and at least one via opening 212 is located atop surface portions of the dielectric film 204. Note that the at least one via opening 212 exposes an upper surface of the interconnect 201.

The structure shown in FIG. 2 is fabricated using interconnect techniques that are well known in the art. First, a wafer (not shown) including various semiconductor devices (not shown) is formed utilizing conventional semiconductor device processing steps such as, for example, complementary metal oxide semiconductor (CMOS) device fabrication.

The first insulator 202 is then deposited atop the wafer utilizing a conventional deposition process such as, for example, chemical vapor deposition (CVD), plasma enhanced chemical vapor deposition (PECVD), evaporation, spin-on coating, and other like deposition processes.

The first insulator 202 is comprised of an organic dielectric material, an inorganic dielectric material or a multilayered stack thereof. The first insulator 202 can be non-porous, porous or a combination of porous and non-porous. Typically, the first insulator 202 has a dielectric constant of about 4.0 or less. All dielectric constants are measured in a vacuum unless otherwise stated. Examples of dielectric materials that can be used as the first insulator 202 include, but are not limited to: $SiO_2$, aromatic thermosetting polyarylene ethers such as SiLK® sold by the Dow Chemical Company, or Flare® sold by Honeywell, carbon doped oxides (i.e., silicate glasses) comprising atoms of Si, C, O and H, silsesquioxanes such as methyl silsesquioxane or hydrido silsesquioxane, tetraethylorthosilicate (TEOS), and organosilanes such as, for example, methyl silane or ethyl silane. The thickness of the first insulator 202 may vary depending on the type of dielectric employed as well as the technique used for depositing the same. Typically, and for illustrative purposes, the first insulator 202 has a thickness from about 500 to about 10,000 Å, with a thickness from about 2000 to about 6000 Å being even more typical.

After depositing the first insulator 202, at least one interconnect 201 including optional diffusion barrier material 203 is formed into the first insulator 202. The at least one interconnect 201 and optional diffusion barrier material 203 are formed by first providing a photoresist layer (not shown) on the upper surface of the first insulator 202. The photoresist layer is patterned by lithography which includes exposing the photoresist layer to a pattern of radiation and then developing the exposed photoresist utilizing a conventional resist developer. The patterned photoresist protects portions of the first insulator 202, while leaving other portions exposed.

The exposed portions of the first insulator 202, not including the patterned photoresist, are then partially removed utilizing a dry etching process or a chemical wet etching process. Examples of dry etching processes that can be used in transferring the pattern from the patterned photoresist to the underlying first insulator 202 include reactive ion etching, plasma etching, ion beam etching, or laser ablation, with reactive ion etching (RIE) being typically used. An example of a wet chemical etching process that can be used at this point of the present invention is diluted HF.

Notwithstanding the type of etching process used, this etching step stops within the first insulator 202 creating a trench (or opening) therein. The trench (or opening) is then optionally lined with a first diffusion barrier material 203 such as, for example, Ta, TaN, Ti, TiN, TiSiN, W, WN, or Ru. The optional diffusion barrier material 203 is formed utilizing a conventional deposition process such as, for example, CVD, PECVD, evaporation, sputtering and other like deposition processes. The thickness of the optional first diffusion barrier material 203 formed on the exposed wall surfaces within the trench (or opening) may vary depending on the type of diffusion barrier material being deposited and the deposition technique that was used in forming the same. Typically, the thickness of the optional first diffusion barrier material 203 is from about 1 to about 100 nm, with a thickness from about 3 to about 80 nm being even more typical.

Next, the trench (or opening), with or without the first diffusion barrier material 203, is filled with an electrically conductive interconnect material. The filling of the trench (or opening) includes a deposition step followed by an optional planarization process. The deposition step includes a conventional deposition process such as, for example, CVD, PECVD, evaporation, sputtering, plating, chemical solution deposition and other like deposition processes. In some embodiments of the present invention, a thin seed layer of the electrically conductive interconnect material can be formed prior to deposition.

The optional planarization process comprises chemical mechanical polishing (CMP), grinding or a combination thereof. It is observed that this step of the present invention forms the embedded interconnect 201 within the first insulator 202.

The electrically conductive interconnect material used in filling the at least one trench (or opening) includes a conductive material such as, for example, polysilicon, polySiGe, or a conductive metal. Some examples of preferred conductive metals that are used in the present invention as the electrically conductive interconnect material include Cu, Al, Al(Cu), and W. It is noted that elements 202, 201 and 203 can be considered as a lower interconnect level in which an upper interconnect level will be subsequently formed thereon; in the present invention, the upper interconnect level includes second insulator 205, interconnects 401 and 402, buried electrically conductive layer 601 and an interconnect including a via in contact with the first interconnect 201.

Dielectric film 204 is then deposited on the first insulator 202 including the at least one embedded interconnect 201 utilizing a conventional deposition process such as, for example, CVD, PECVD, evaporation, chemical solution deposition and other like deposition processes. The dielectric film 204 comprises any material that can serves as an etch stop layer between the first insulator 202 and the second insulator 205 (to be subsequently formed). Typically, the dielectric film 204 comprises one of $Si_3N_4$, SiC, or $SiO_2$. Multilayers of these materials are also contemplated in the present invention. The dielectric film 204 has a thickness that is typically from about 3 to about 100 nm, with a thickness from about 10 to about 80 nm being even more typical for the dielectric film 204.

After depositing the dielectric film 204, a second insulator 205 is deposited atop the dielectric film 204 utilizing one of the deposition techniques described above for the first insulator 202. The second insulator 205 comprises a porous or non-porous dielectric material which can be the same or different dielectric material as the first insulator 202. The thickness of the second insulator 205 may vary depending on the deposition technique used as well as the type of dielectric material being deposited. Typically, the thickness of the second insulator 205 is from about 500 to about 10,000 Å, with a thickness from about 2000 to about 6000 Å being even more typical.

Line openings 210 and at least one via opening 212 are then formed into the second insulator utilizing conventional lithography and etching. Note that the at least one via opening 212, which includes an overlying line opening 210, exposes an upper surface of the interconnect 201.

Figure 3:
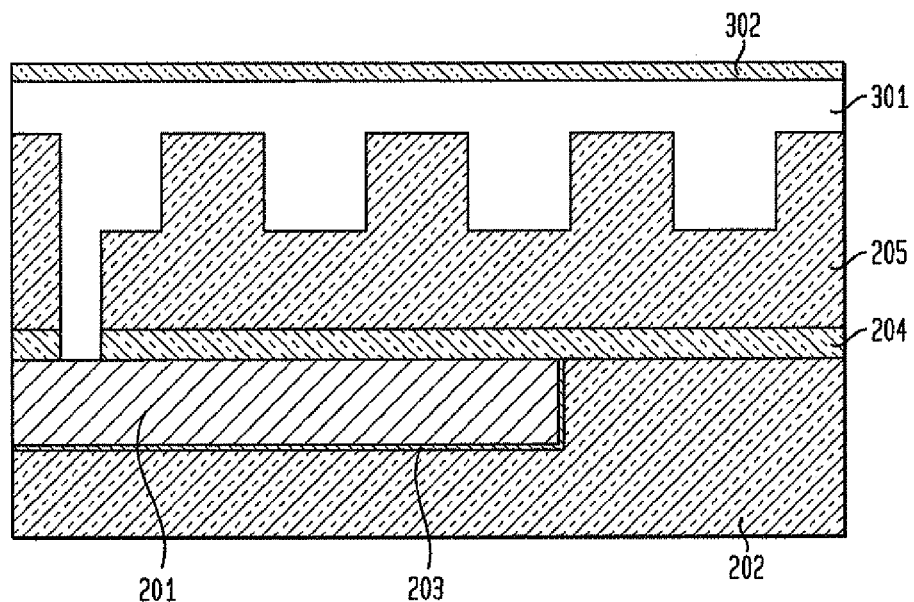

After providing the structure shown in FIG. 2, an organic planarizing material 301 is first deposited and the deposited organic material is subjected to a planarization process. As shown in FIG. 3, deposition of the organic planarizing material 301 fills in the at least one via opening 212 and the line openings 210 and covers the upper surface of the second dielectric 205. Suitable deposition processes used in providing the organic planarizing material 301 to the structure include spin-on, CVD, PECVD, evaporation, chemical solution deposition and other like deposition techniques. CMP or grinding can be used to planarize the deposited organic planarizing material 301.

The organic material 301 used in the present invention comprises any organic planarizing material including, for example, antireflective coatings, NFC® and TDP® from JSR, PN® from Promerus, ODL® from ShinEtsu, and NCA® and GF® from Brewer.

After providing the organic planarizing material 301 to the structure, an oxide layer 302 such as a low temperature oxide (LTO) is deposited. The thickness of the oxide layer 302 is typically from about 100 to about 2000 Å, with a thickness from about 400 to about 800 Å being more typical. The structure shown in FIG. 3 also includes the oxide layer 302 formed atop the organic planarizing material 301.

Figure 4:
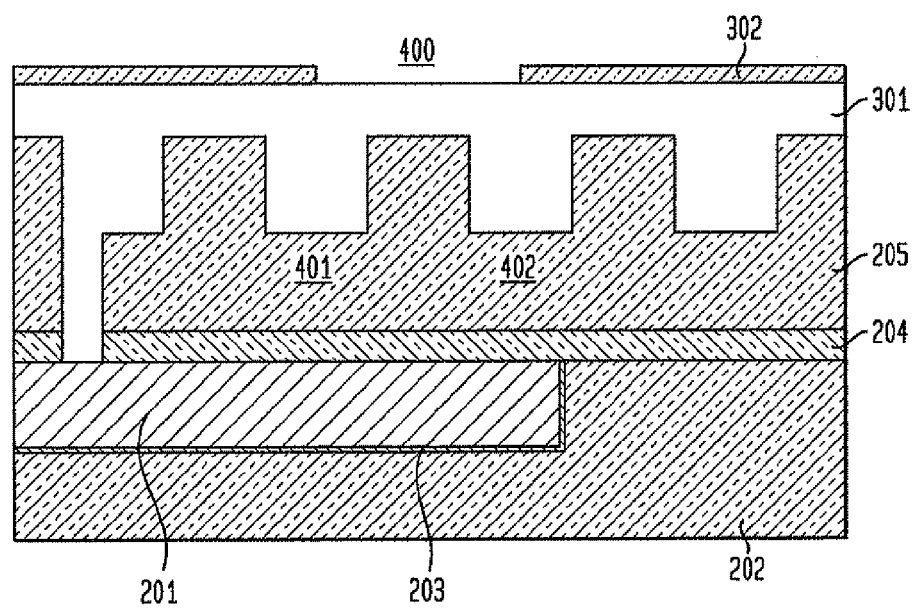

FIG. 4 shows the structure after at least one area 400 for building an anti-fuse structure is formed. Specifically, the at least one area 400 for building the anti-fuse structure is formed by lithography and etching. In particular, a pattern mask (not shown) is formed which exposes a portion of the oxide layer 302, and etching such as RIE is used to open the oxide layer 302 exposing portions of the underlying organic planarizing material 301. Note that the at least one area 400 is typically located above portions of neighboring lines openings 210, which can also include via opening 212. These regions are labeled as 401 and 402 and they will become interconnects of the upper interconnect level.

Figure 5A:
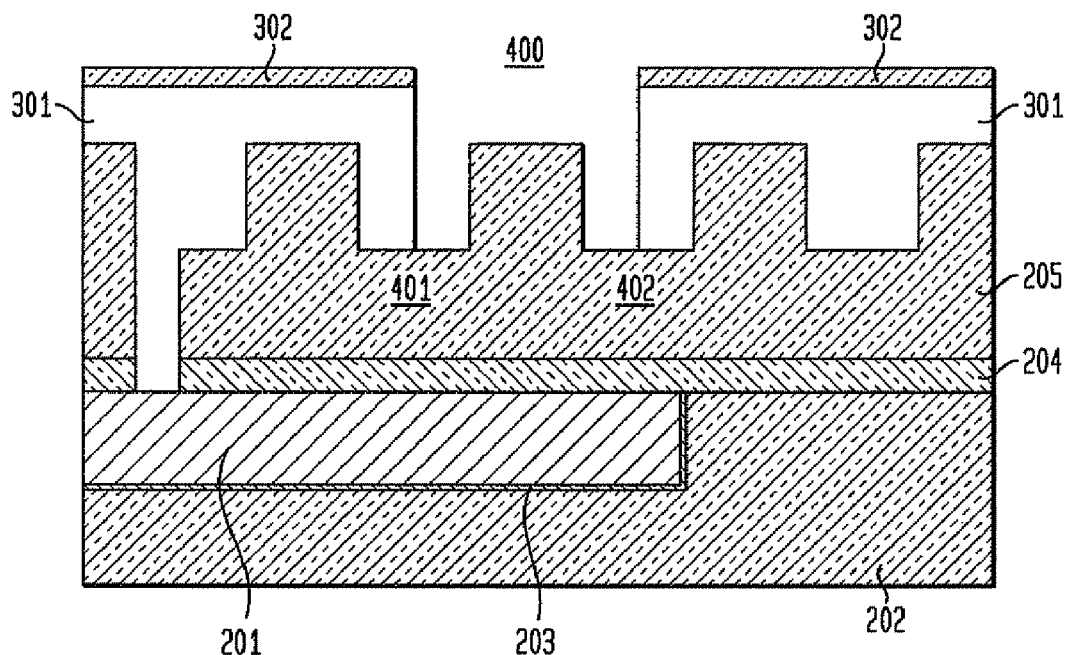
Figure 5B:
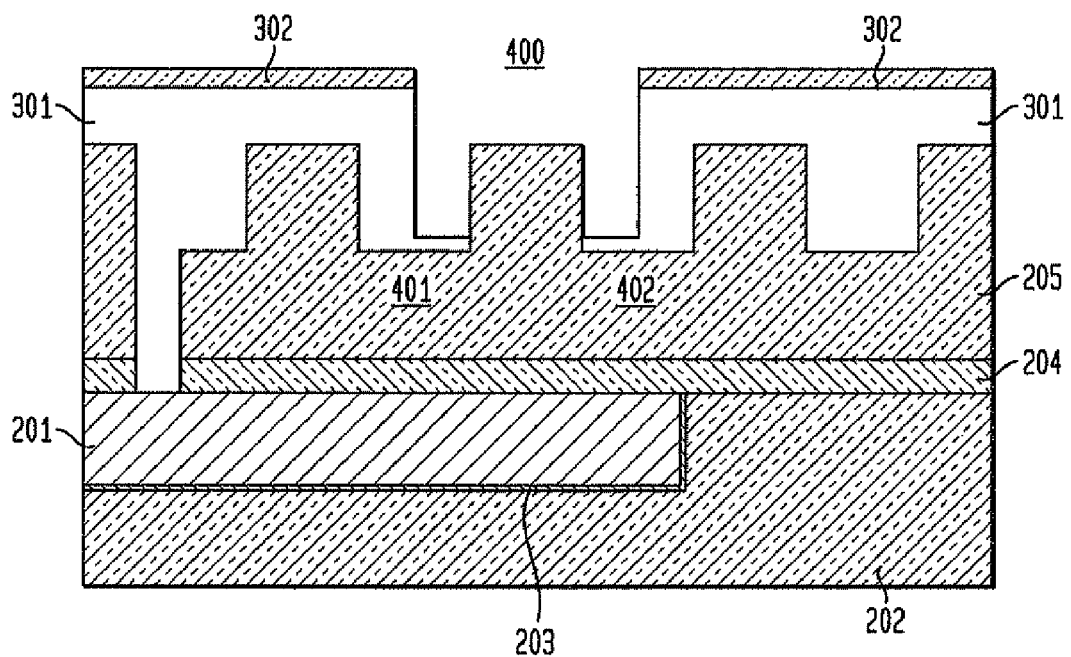

A chemical stripping process, which selectively removes the organic planarizing material 301, is then used to remove the exposed organic planarizing material 301 from the structure. This process either completely strips out the exposed organic planarizing material 301 from the structure, as is shown in FIG. 5A, or it partially strips out the organic planarizing material 301 and leaves some of the organic planarizing material 301 on the bottom surfaces of the line openings 210, as is shown in FIG. 5B. For the clarity, the remaining processing steps of the present invention will described with use of the structure shown in FIG. 5A.

A buried electrically conductive layer, e.g., buried metallic layer, 601 is formed in the structure shown in FIG. 5A utilizing atomic layer deposition (ALD). It is noted that the buried electrically conductive layer after deposition and subsequent planarization (to be described herein below) forms the anti-fuse material of the inventive structure. ALD permits deposition and penetration of the electrically conductive material into the exposed portions of the second insulator 205 that are not covered with the organic planarizing material 301. The buried electrically conductive material layer 601 serves as an anti-fuse in the inventive structure that can be activated electrically when there is a decrease in resistance between two neighboring interconnects, i.e., interconnects 401 and 402. The buried electrically conductive layer 601 comprises a conductive material such as, for example, Ta, TaN, W, Cu, Al, Pt, Pd, Ru, Rh, Au, and Ag. Multilayers are also contemplated.

The buried conductive layer 601 has a thickness after deposition and penetration from about 2 to about 200 Å, with a thickness from about 10 to about 30 Å being more typical.

Figure 6:
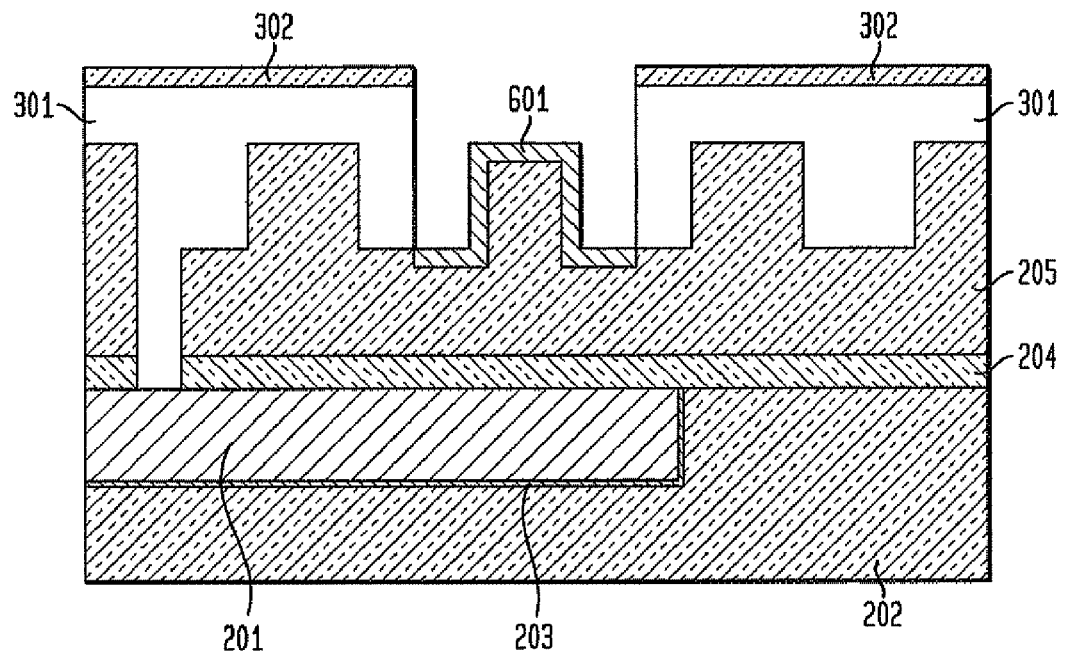

ALD is performed by utilizing conventional conditions that are well known in the art. For example, ALD is performed at a temperature from about 25° to about 400° C., using a metal precursor that includes at least one of the above-mentioned conductive materials. The structure including the buried electrically conductive layer 601 is shown, for example, in FIG. 6.

Figure 7:
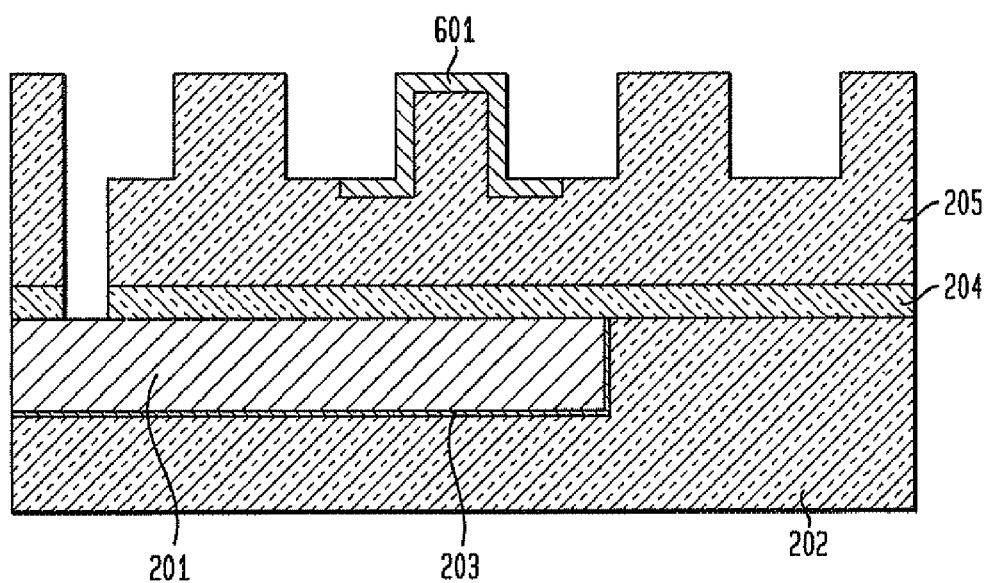

FIG. 7 shows the structure that is formed after oxide layer 302 and remaining organic planarizing material 301 are removed from the structure. These materials are removed utilizing a combination of chemical etching and stripping.

Figure 8:
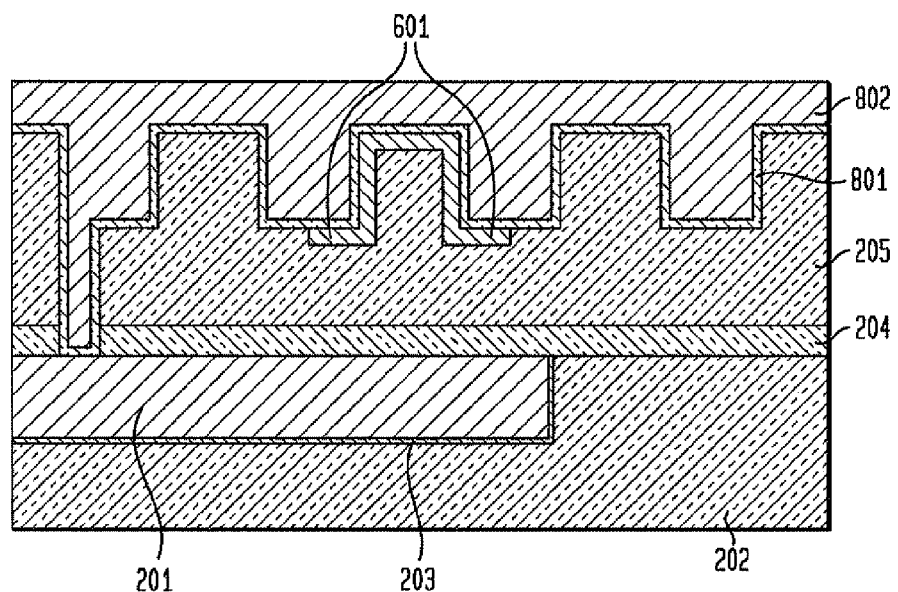

Next, an optional second diffusion barrier layer 801 and an electrically conductive second interconnect material 802 are sequentially deposited on the structure shown in FIG. 7 to at least fill the via opening 212 and the line openings 210. The resultant structure formed after these deposition steps is shown in FIG. 8. The optional second diffusion barrier 801 is formed utilizing one of the above-mentioned deposition processes mentioned in connection with the first diffusion barrier material 203. The optional second diffusion barrier 801 can comprise one of the materials also mentioned in connection with the first optional diffusion barrier material 203. The thickness of the optional second diffusion barrier layer 801 is also within the ranges mentioned above for the first optional diffusion barrier 203 material.

The electrically conductive second interconnect material 802 comprises one of the conductive materials as mentioned for the interconnect 201 and one of those deposition processes used in forming the first interconnect 201 can be used in forming electrically conductive second interconnect material 802. In some embodiments of the present invention, a thin seed layer of the electrically conductive material can be formed prior to deposition. The thickness of the electrically conductive second interconnect material 802 formed may vary depending on the material and deposition process used. Typically, the electrically conductive second interconnect material 802 has a thickness from about 500 to about 15,000 Å, with a thickness from about 5000 to about 8000 Å being even more typical.

Figure 9:
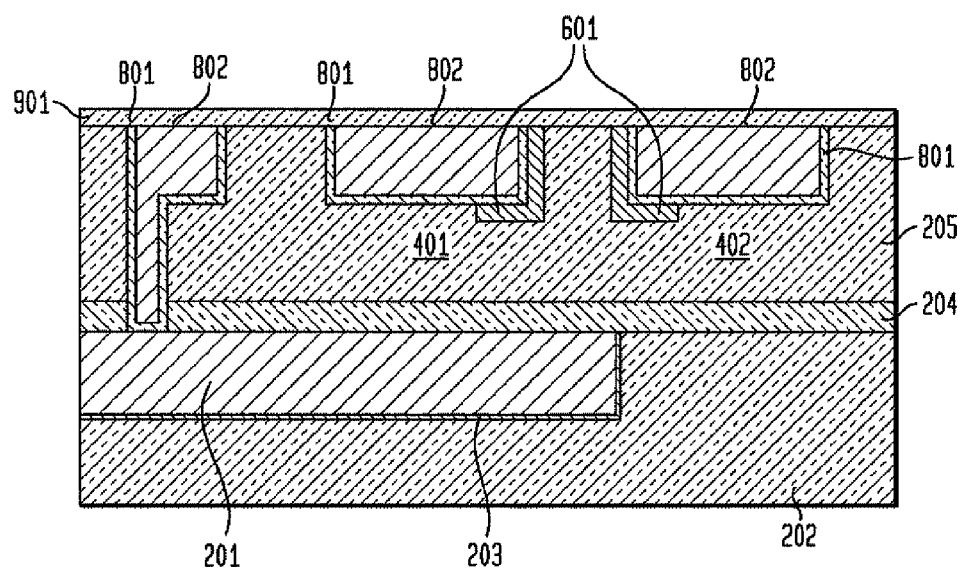

FIG. 9 shows the structure after subjecting the structure of FIG. 8 to a planarization process such as CMP and deposition of a dielectric capping layer 901 on the planarized surface. Note that the planarization process provides a structure in which the electrically conductive second interconnect material 802 and the optional second diffusion barrier 801 each have an upper surface that is substantially coplanar with an upper surface of the second insulator 205; this planarization process also removes buried electrically conductive layer 601 that is present in upper horizontal surface portions of the second insulator 205. Thus, the buried electrically conductive layers 601 between adjacent interconnects in the second insulator 205 are not directly connected to each other.

The dielectric capping layer 901 mentioned above comprises an oxide, nitride, oxynitride or multilayers thereof The dielectric capping layer 901 is formed by CVD, PECVD, evaporation or other like deposition processes. Typically, the dielectric capping layer 901 has a thickness after deposition from about 3 to about 100 nm, with a thickness from about 10 to about 80 nm being even more typical.

Further interconnect levels as desired (or warranted), with or without the buried electrically conductive layer 601, can be formed atop the upper interconnect level described above.

Figure 10A:
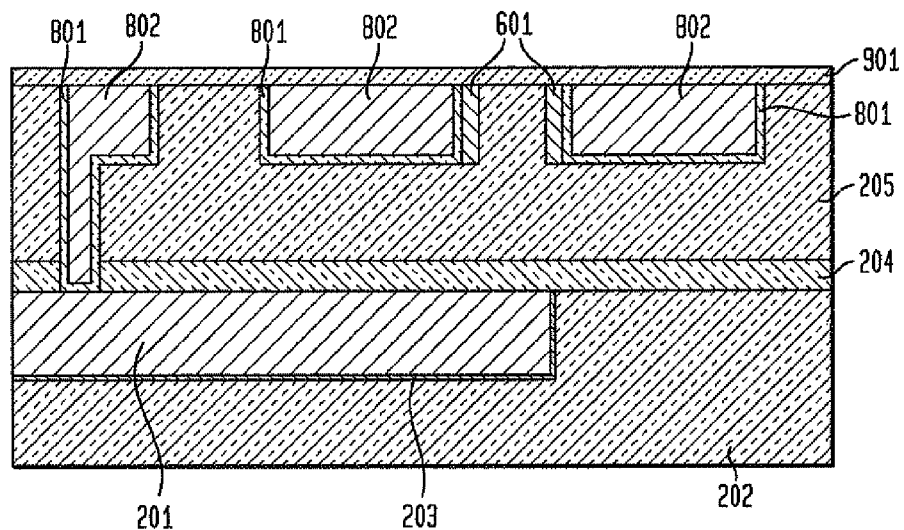
FIGS. 10A-10C are pictorial representations (through cross sectional views) illustrating alternative anti-fuse structures of the present invention.
Figure 10B:
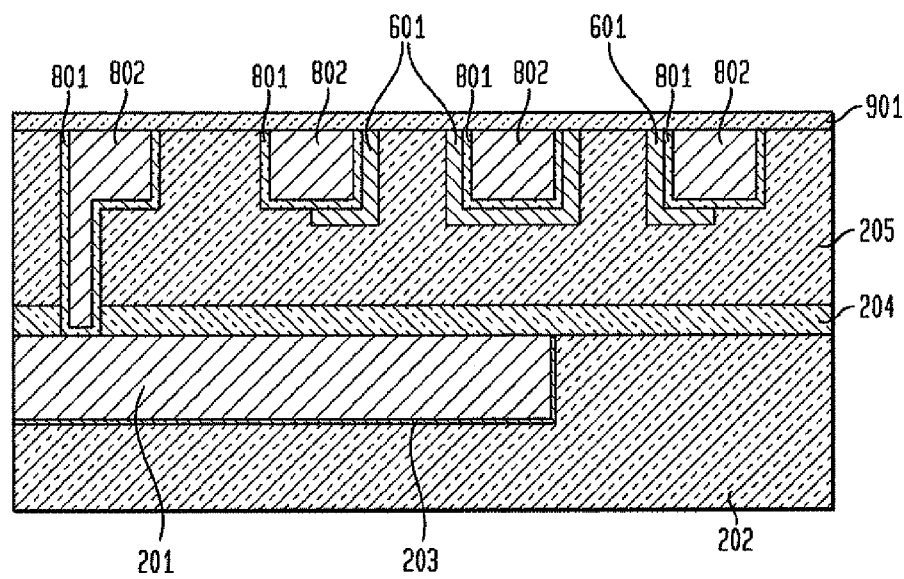
Figure 10C:
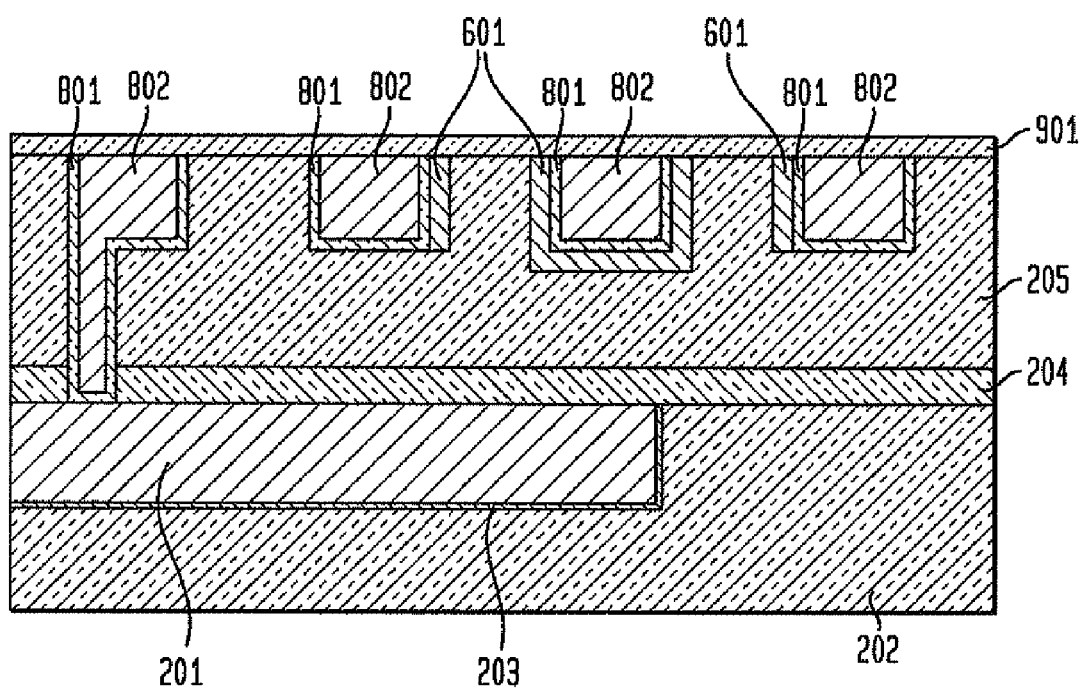

FIGS. 10A-10C show some additional structures that can be formed utilizing the method of the present invention described above. The structures are formed utilizing the same basic processes steps as described above in FIGS. 2-9 except for manipulating the location of area 400.

It is noted that when a bias is applied between the interconnects 401 or 402 including the buried electrically conductive layer 601, a region of second insulator 205 located between adjacent interconnects 401 and 402 becomes leaky, i.e., a current is generated and flows in that region.

One advantage of the present invention over the prior art is that no extra layer of anti-fuse material is required and the inventive method is compatible with current processing without requiring extra critical masking. The process costs of the inventive method are therefore lower. In addition, and unlike prior art structures, the inventive structure does not require a sandwiched anti-fuse material layer between two 'disconnected' conductive materials. Thus, the inventive structure and method offer more flexibility for circuit design than the prior art anti-fuse structure described herein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A semiconductor structure comprising:
an insulator including at least a pair of adjacent interconnects, each interconnect of said pair includes a diffusion barrier material, an electrically conductive interconnect material located on an upper surface of the diffusion barrier material, and a buried electrically conductive layer embedded in a surface of said insulator and in contact with a bottom surface of said diffusion barrier material, wherein each of said buried electrically conductive layers is located on at least one sidewall of said diffusion barrier material of each respective interconnect, each of said buried electrically conductive layers has an upper surface that is coplanar with an upper surface of said electrically conductive material, and each of said buried electrically conductive layers is separated by a dielectric region which permits current flow when a bias is applied between said pair of adjacent interconnects and wherein at least one of said buried electrically conductive layers is located only partially beneath, and on one side of, said diffusion barrier material that contains one of said interconnects.

2. The semiconductor structure of claim 1 wherein said insulator is an organic or inorganic dielectric material.

3. The semiconductor structure of claim 2 wherein said insulator has a dielectric constant of about 4.0 or less.

4. The semiconductor structure of claim 1 wherein said insulator comprises one of $SiO_2$, an aromatic thermosetting polyarylene ether, a carbon doped oxide comprising atoms of Si, C, O and H, a silsesquioxane, tetraethylorthosilicate (TEOS), or an organosilane.

5. The semiconductor structure of claim 1 wherein said diffusion barrier material comprises one of Ta, TaN, Ti, TiN, TiSiN, W, WN or Ru.

6. The semiconductor structure of claim 1 wherein said electrically conductive interconnect material comprises Cu, Al, W or Al(Cu).

7. The semiconductor structure of claim 1 wherein each of said buried conductive layers comprises Ta, TaN, W, Cu, Al, Pt, Pd, Ru, Rh, Au, or Ag.

8. The semiconductor structure of claim 1 further comprising a dielectric capping layer atop a surface of said insulator including said pair of adjacent interconnects.

9. The semiconductor structure of claim 1 further comprising a conductive filled via in said insulator which is in contact with an underlying interconnect embedded in an underlying insulator.

10. The semiconductor structure of claim 9 wherein said underlying insulator is separated in part from said insulator by a dielectric film, said dielectric film having an opening in which said conductive filled via is in contact with said underlying interconnect.

11. A semiconductor structure comprising:
a first insulator including at least one embedded first interconnect region; and
a second insulator overlying said first insulator, said second insulator comprising at least a pair of adjacent second interconnect regions, each interconnect region of said pair includes a diffusion barrier material, an electrically conductive interconnect material located on an upper surface of the diffusion barrier material, and a buried electrically conductive layer embedded in a surface of said second insulator and in contact with a bottom surface of said diffusion barrier material, wherein each of said buried electrically conductive layer is located on at least one sidewall of said diffusion barrier material of each respective second interconnect region, each of said buried electrically conductive layers has an upper surface that is coplanar with an upper surface of said electrically conductive material, and each of said buried electrically conductive layers is separated by a dielectric region which permits current flow when a bias is applied between said pair of adjacent interconnect regions and wherein at least one of said buried electrically conductive layers is located only partially beneath, and on one side of, said diffusion barrier material that contains one of said interconnects.

12. The semiconductor structure of claim 11 wherein said first and second insulators are the same or different dielectric material selected from organic and inorganic dielectric materials.

13. The semiconductor structure of claim 12 wherein said first and second insulators have a dielectric constant of about 4.0 or less.

14. The semiconductor structure of claim 11 wherein said first and second insulators comprise one of $SiO_2$, an aromatic thermosetting polyarylene ether, a carbon doped oxide comprising atoms of Si, C, O and H, a silsesquioxane, tetraethylorthosilicate (TEOS), or an organosilane.

15. The semiconductor structure of claim 11 wherein said first interconnect region includes an optional diffusion barrier material and an electrically conductive interconnect material.

16. The semiconductor structure of claim 11 wherein said diffusion barrier material comprises one of Ta, TaN, Ti, TiN, TiSiN, W, WN or Ru.

17. The semiconductor structure of claim 11 wherein said electrically conductive interconnect material comprises Cu, Al, W or Al(Cu).

18. The semiconductor structure of claim 11 wherein each of said buried conductive layers comprises Ta, TaN, W, Cu, Al, Pt, Pd, Ru, Rh, Au or Ag.

19. The semiconductor structure of claim 11 further comprising a dielectric capping layer atop a surface of said second insulator including said pair of adjacent interconnect regions.

20. The semiconductor structure of claim 11 further comprising a conductive filled via in said second insulator which is in contact with said first interconnect region of said first insulator.

21. The semiconductor structure of claim 20 wherein said first insulator is separated in part from said second insulator by a dielectric film, said dielectric film having an opening in which said conductive filled via is in contact with said first interconnect region.

22. A semiconductor structure comprising:
an insulator including at least a pair of adjacent interconnects, each interconnect of said pair includes a diffusion barrier material, an electrically conductive interconnect material located on an upper surface of the diffusion barrier material, and a buried electrically conductive layer embedded in a surface of said insulator, wherein each of said buried electrically conductive layers is located on at least one sidewall of said diffusion barrier material of each respective interconnect, each of said buried electrically conductive layers has an upper surface that is coplanar with an upper surface of said electrically conductive material, and each of said buried electrically conductive layers is separated by a dielectric region which permits current flow when a bias is applied between said pair of adjacent interconnects and wherein at least one of said buried electrically conductive layers is located only on one side of said diffusion barrier material that contains one of said interconnects.

* * * * *